(12) United States Patent
Yokoyama et al.

(10) Patent No.: US 6,294,467 B1
(45) Date of Patent: Sep. 25, 2001

(54) PROCESS FOR FORMING FINE WIRING

(75) Inventors: Takashi Yokoyama; Koji Kishimoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/270,855

(22) Filed: Mar. 17, 1999

(30) Foreign Application Priority Data

Mar. 18, 1998 (JP) .................................................. 10-089262

(51) Int. Cl.[7] .................................................. H01L 21/44
(52) U.S. Cl. .......................... 438/680; 438/683; 438/685; 438/627; 438/761
(58) Field of Search .................................... 438/627, 643, 438/653, 927, 648, 656, 683, 685; 257/751, 761

(56) References Cited

U.S. PATENT DOCUMENTS

| | | | |
|---|---|---|---|
| 4,356,374 | * 10/1982 | Noyori et al. | 219/121 |
| 4,793,201 | * 12/1988 | Kanai et al. | 74/424.8 |
| 5,266,521 | * 11/1993 | Lee et al. | 437/188 |
| 5,407,855 | * 4/1995 | Maniar et al. | 437/60 |
| 5,523,177 | * 6/1996 | Kosed et al. | 429/40 |
| 5,561,082 | * 10/1996 | Matsuo et al. | 437/187 |
| 5,585,673 | * 12/1996 | Joshi et al. | 257/751 |
| 5,670,421 | * 9/1997 | Nishitani et al. | 437/192 |
| 5,731,634 | * 3/1998 | Matsuo et al. | 257/752 |
| 5,846,673 | * 12/1998 | Saidi et al. | 429/195 |
| 5,969,422 | * 10/1999 | Teng et al. | 257/762 |
| 6,002,174 | * 12/1999 | Akram et al. | 257/751 |

FOREIGN PATENT DOCUMENTS

| | | |
|---|---|---|
| H02-183252 | 7/1990 | (JP) . |
| H03-083023 | 4/1991 | (JP) . |
| H06-097160 | 4/1994 | (JP) . |
| H06-236931 | 8/1994 | (JP) . |
| H10-135605 | 5/1998 | (JP) . |

OTHER PUBLICATIONS

C.Y. Chang and S.M. Sze, ULSI Technology, 1996, McGraw–Hill, pp. 394–395.*

"Tantalum as a diffusion barrier between copper and silicon", by Karen Holloway, et al., Appl. Phys. Lett. 57 (17), Oct. 22, 1990, pp. 1736–1738.

* cited by examiner

Primary Examiner—Matthew Smith
Assistant Examiner—Renzo N. Rocchegiani
(74) Attorney, Agent, or Firm—Scully, Scott, Murphy & Presser

(57) ABSTRACT

The present invention is directed to a process for manufacturing a semiconductor device. It includes a step for forming a fine wiring, and provides a process for uniformly and positively forming a film of a barrier metal, such as tantalum, for preventing the metal, such as copper, which becomes the first material for the wiring, from diffusing into a silicon oxide film. The process involves depositing an oxide of a barrier metal on a substrate which is formed with a via hole by a process such as CVD process. A high quality barrier metal film is formed by reducing the oxide by applying a negative potential to the oxide in a solution in which hydrogen ions are present. Subsequently an embedded wiring is formed by embedding the main metal by a plating process and the like and polishing to remove unnecessary portions.

17 Claims, 6 Drawing Sheets

FIG. 7 (a)    PRIOR ART
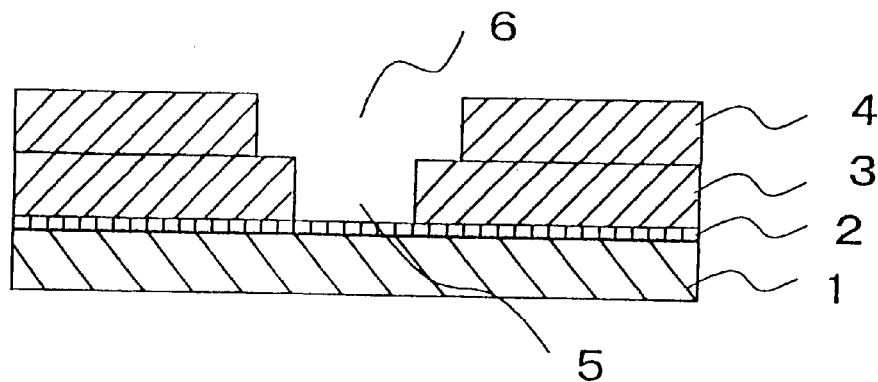
FIG. 7 (b)    PRIOR ART
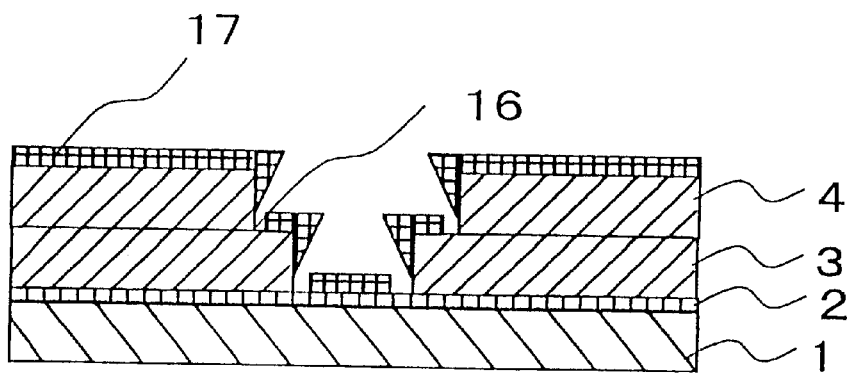
FIG. 7 (c)    PRIOR ART
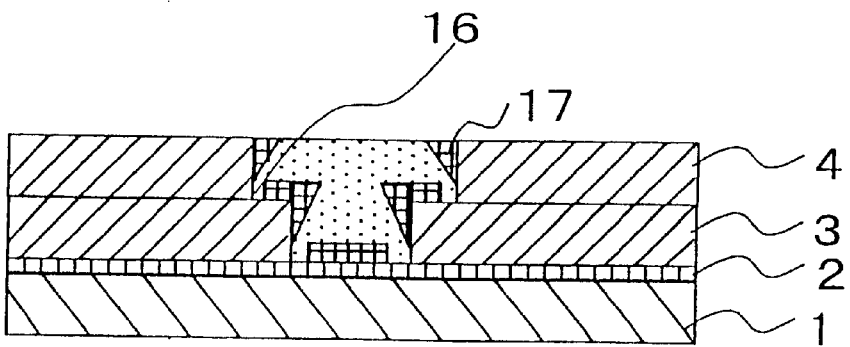

PROCESS FOR FORMING FINE WIRING

FIELD OF THE INVENTION

The present invention relates to a process for forming a fine wiring for LSI, and in particular to a process for forming a fine wiring using a chemical vapor deposition process.

BACKGROUND

Ever reducing design rule has become more strict to meet the requirements to increase the scale of integration and speed of the LSI. Reduction in wiring pitch has led to reduction in the width of wiring and distance between the wirings. However, reduction in thickness of wiring has not been largely achieved in comparison with the reduction in wiring pitch in order to prevent an increase in resistance of wiring.

Accordingly, the aspect ratio of the wiring height to the wiring width or distance between wirings tends to increase. Embedding of metal has become more difficult in particular when trench wiring is used. Similarly, the aspect ratio of via for connecting with an active area or underlying wiring has also increased, so that embedding of metal has become more difficult.

Efforts to use materials having a low resistance have been actively made to increase the speed of devices. Researches have been carried out to use copper-based wiring materials in lieu of conventional aluminum-based wiring materials.

SUMMARY OF THE DISCLOSURE

However, in the course of the investigations toward the present invention the following problems have been encountered. Namely, since it is difficult to etch copper by a dry process which is used for aluminum, LSIs are often formed into a dual damascene structure by a process comprising preliminarily forming a wiring pattern of trench and the like on an insulating film of silicon oxide and the like, embedding copper in the formed insulating film by a sputtering process and making the device planar by a chemical and mechanical polishing process. When the dual damascene structure in which wirings and contacts are simultaneously formed is adopted to meet the requirements for high aspect ratio of trench wiring and multilayered wiring, embedding of a metal becomes more difficult.

Since copper will diffuse into a silicon oxide film when it is in direct contact with the silicon oxide film (refer to, for example, Appl. Phys. Lett. 57 (17), Oct. 22, 1990), a barrier metal such as tantalum and TiN is necessary between the silicon oxide film and copper. Coverage of a barrier metal which is deposited by a sputtering process has raised concerns. If the coverage of the barrier metal or power supply layer is poor also when a copper wiring is formed by a plating process which is excellent in embedding ability, the copper wiring having a high reliability and excellent embedding ability could not be formed.

Problems of the prior art using the dual damascene structure will be described with reference to FIG. 7. As shown in FIG. 7(a), a first and second openings 5 and 6 of a via which will provide a wiring pattern are formed in a first and second interlayer insulating films 3 and 4, respectively. Subsequently, a barrier metal 17 such as tantalum or TiN is sputtered by a sputtering process as shown in FIG. 7(b).

However, it is hard to form the barrier metal film 17 in such a manner that an excellent convergence is provided when the pattern is complicated and has a high aspect ratio. When the coverage of the barrier metal film 17 is poor, the underlying layer may be exposed at an area 16. The copper which is deposited on the exposed area is liable to diffuse into the silicon oxide film. This may cause malfunctions of the resultant device.

Therefore, the present invention has been achieved in view of the above-mentioned problems. It is a main object of the present invention to provide a fine wiring and a process for manufacturing the same, which enables a uniform and good quality barrier metal film to be formed on a pattern side wall and its bottom in such a manner that the step overage is excellent without exposing the underlying layer or a pattern having a high aspect ratio of the wiring height to the wiring width or the distance between wirings.

It is another object of the present invention to provide a process which enables a fine wiring having a low resistance to be formed by uniformly loading a dominant wiring metal into a pattern on which a barrier metal is formed.

Further objects of the present invention will become apparent in the entire disclosure.

Briefly, in order to accomplish the above-mentioned objects, the present invention contemplates providing a metal film which will become a barrier metal film by reducing a metal oxide film after the metal oxide film has been deposited when the barrier metal film adapted to become a wiring layer is to be formed. Specifically, the present invention has features as follows:

According to one aspect of the present invention, there is provided a process for forming a fine or micro-wiring, wherein in order to form a wiring layer, a metal film which becomes the wiring layer is formed by reducing a metal oxide film or metal salt film after the wiring layer has been deposited as the metal oxide film or metal salt film.

According to a second aspect, there is provided a process for forming a fine wiring, wherein in order to form a barrier metal film on which a wiring layer is formed, a metal film which becomes the barrier metal film is formed by reducing a metal oxide film or metal salt film after the barrier metal film has been deposited as the metal oxide film or metal salt film.

According to a third aspect, there is provided a process for forming a fine wiring, wherein in order to form a barrier metal film on a pattern which is formed on an interlayer insulating film on a substrate, the barrier metal film is formed by coating an insulating layer with a metal oxide film or metal salt film and by reducing the metal oxide film or metal salt film and in that the wiring layer is formed into the pattern by an electrolytic plating or electroless plating process.

According to a fourth aspect of the present invention there is provided a process for forming fine wiring. The process comprises the steps of: (a) forming a film of a metal oxide or metal salt, containing a first metal element; or containing a first metal element and one or more additional metal elements which are different from the first metal element, which becomes a barrier metal film or wiring layer as any one of layers which are provided on a substrate; and (b) converting said metal oxide film or metal salt film into a metal film by reducing it in a solution which contains hydrogen ions.

According to a fifth aspect of the present invention, the process comprises the steps of: (a) forming a film of a metal oxide or metal salt, containing a first metal element; or containing a first metal element and one or more additional metal elements which are different from the first metal element, which becomes a barrier metal film or wiring layer as any one of layers which are provided on a substrate; (b)

converting said metal oxide film or metal salt film into a metal film by reducing it in a solution which contains hydrogen ions; and (c) heat treating said metal film under a reduced pressure or in an inert atmosphere.

According to a sixth aspect of the present invention, the process comprises the steps of: (a) forming a film of a metal oxide or metal salt, containing a first metal element; or containing a first metal element and one or more additional metal elements which are different from the first metal element, which becomes a barrier metal film as any one of layers which are provided on a substrate; (b) converting said metal oxide film or metal salt film into a metal film by reducing it in a solution which contains hydrogen ions; and (c) forming a wiring layer on the metal film which becomes the barrier metal film by electrochemically precipitating ions of the metal in an electrolytic solution which contains ions of the metal which becomes a main material of the wiring layer.

According to a further aspect of the present invention, the process comprises the steps of: (a) forming a film of a metal oxide or metal salt, containing a first metal element; or containing a first metal element and one or more additional metal elements which are different from the first metal element, which becomes a barrier metal film or wiring layer as any one of layers which are provided on a substrate; (b) converting said metal oxide film or metal salt film into a metal film by reducing it in a solution containing hydrogen ions; and (c) forming a wiring layer on the metal film by electrochemically precipitating ions of the metal by an electroless process in an electrolytic solution which contains ions of the metal which becomes a main material of the wiring layer.

In the above-mentioned present invention, it is preferred that a plurality of metals which will form the barrier metal film or the wiring layer comprises a main metal and a metal to be added to the main metal. The metal to be added is selected from such a combination of metals such that the electrode potential required for reducing the metal to be added to ions is higher than a standard electrode potential required for reducing the film of the oxide or salt of the main metal to metal at the reducing step (b), whereby the metal to be added is removed as ions in the solution at the step (b) for reducing the plurality of metals which form metal oxide or metal salt film which becomes the barrier metal film or the wiring layer.

In a further aspect of the present invention, the metal oxide or metal salt film containing a first metal element; or containing a first metal element and one or more additional metal elements which are different from the first metal element, which will form the barrier metal film or wiring layer may be formed by a chemical vapor deposition process at the step (a).

In a still further aspect of the invention, when the metal oxide or metal salt film containing a first metal element; or containing a first metal element and one or more additional metal elements which are different from the first metal element which will form the barrier metal film or wiring layer is formed by a chemical vapor deposition process at the step (a), a compound gas which contains an element having an electrical conductivity is incorporated into the metal oxide film or metal salt film.

In a still further aspect of the present invention, an element having an electrical conductivity is introduced into the metal oxide film or metal salt film prior to the reducing step (b), after the metal oxide or metal salt film containing a first metal element; or containing a first metal element and one or more additional metal elements which are different from the first metal element which will form the barrier metal film or wiring layer has been formed by a chemical vapor deposition process at the step (a).

In the present invention the metal oxide film or metal salt film is deposited within any patterned part such as recess, groove or via hole. Particularly the metal oxide film or metal salt film is deposited on any of layers disposed on the substrate including inner wall of a via hole disposed on said any of layers. Typically the resultant deposited structure becomes a damascene structure or double damascene structure having a complete coverage of the deposited layer or intermediate layer.

Now, the present invention will be described by way of embodiments which exemplarily show modes of embodying the invention and examples.

BRIEF DESCRIPTION OF THE DRAWINGS

FIG. 7(a), FIG. 7(b) and FIG. 7(c) are Schematic sectional views explaining a prior art process for forming a fine wiring.

PREFERRED EMBODIMENTS OF THE INVENTION

Figure 1:
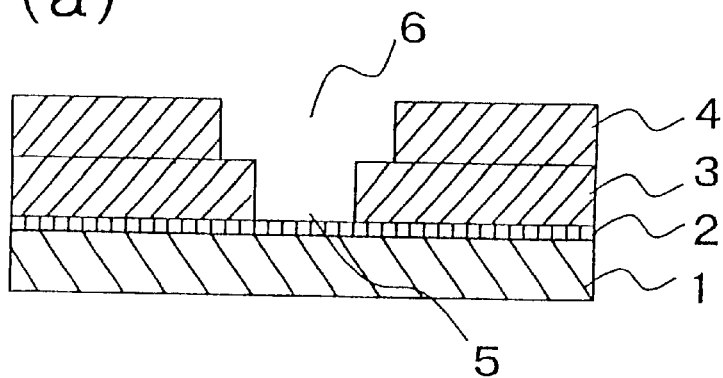
FIG. 1(a), FIG. 1(b) and FIG. 1(c) are schematic sectional views showing a sequence of steps of a process for forming a fine wiring of the first example of the present invention.
Figure 1:
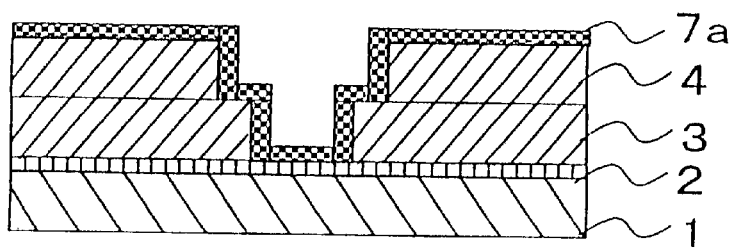
Figure 1:
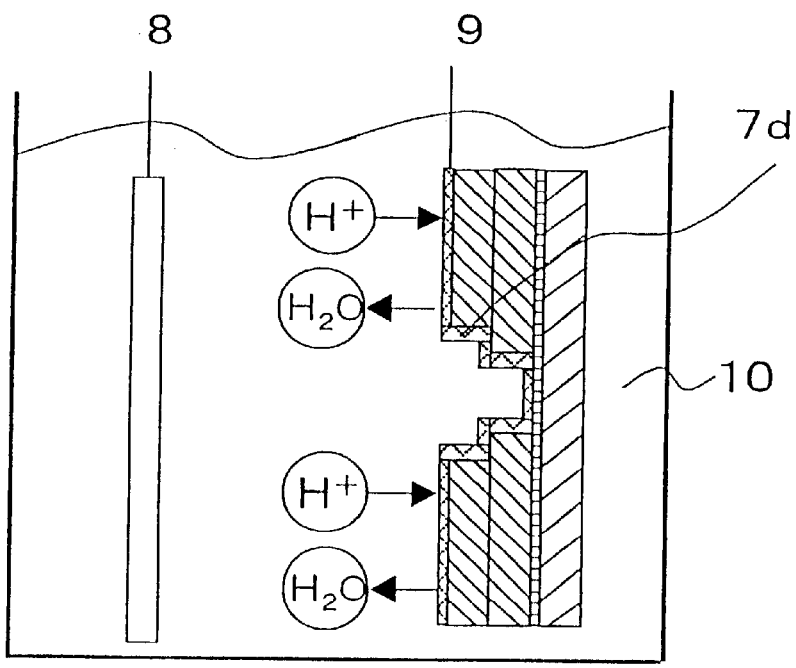

In a preferred embodiment, a process for forming a fine wiring in accordance with the present invention comprises the steps of; (a) forming on a substrate a metal oxide film (7a in FIG. 1(b)) made of a first metal element or one or more elements which are different from the first metal element, acting as a barrier metal using a chemical vapor deposition (CVD) process; (b) converting the formed metal oxide film into a metal film (7d in FIG. 1(c) which provides a barrier metal by reducing the formed metal oxide film in an aqueous solution (10 in FIG. 1(c)) which contains hydrogen ions; and (c) forming a metal wiring layer (13b in FIG. 2(e)) on a metal film (7d in FIG. 2(e)) by electrochemically precipitating the ions of said metal on the metal film (7d) acting as the barrier metal in a plating bath (11 in FIG. 2(d)) which contains ions of metal (for example, $Cu^{2+}$ions) which is a main material for wiring.

EXAMPLES

In order to describe the above-mentioned embodiment in more detail, the examples of the present invention will now be described with reference to drawings.

Example 1

Figure 2A:
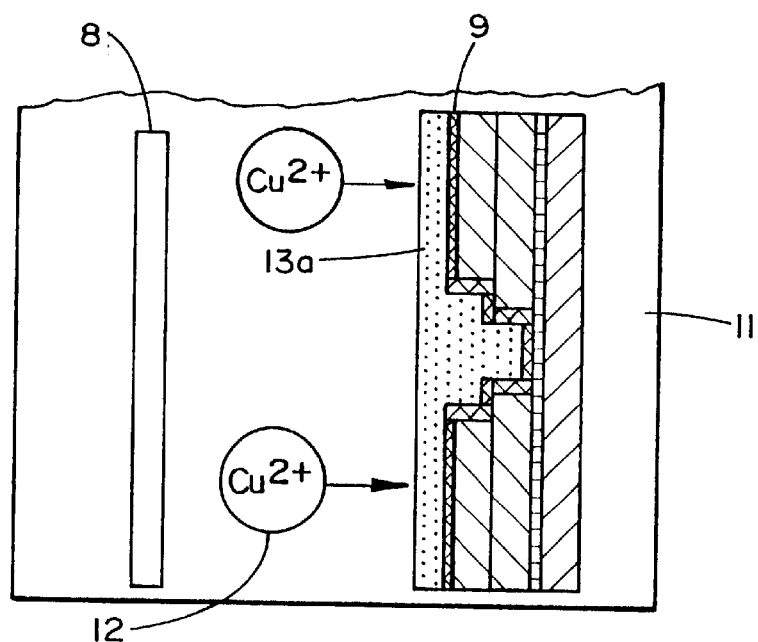
FIG. 2(a), FIG. 2(b) and FIG. 2(c) are schematic sectional views showing a sequence of steps of a process for forming a fine wiring of the first example of the present invention.
Figure 2B:
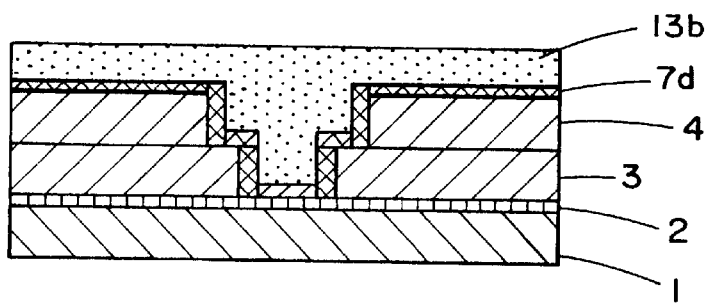
Figure 2C:
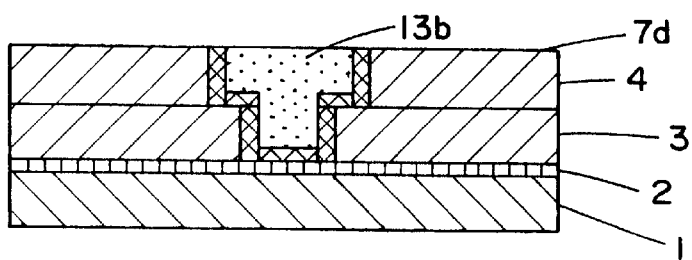

A first example of the present invention will now be explained. FIGS. 1 and 2 are schematic sectional views explaining the first example of the process for forming a fine wiring in accordance with the present invention. They are sectional views showing a sequence of steps of the process of forming the fine wiring. FIGS. 1 and 2 are divided for convenience of formulating of the drawing.

Referring now to FIG. 1, a lower layer wiring 2 is formed on a silicon substrate 1 in which elements such as transistors are formed. A first interlayer insulating film 3 having a thickness of 10 nm to 1000 nm is formed on the lower layer wiring 2 and a second interlayer insulating film 4 having a thickness of 10 nm to 1500 nm is formed on the film 3. At this time, these interlayer insulating films are formed by a CVD or coating process. Material to be used may include inorganic materials such as silicon oxide, fluorine-containing silicon oxide, polysilazane, hydrogensilsesquioxane, organic materials such as Parylene, benzocyclobutene, polyimide, Teflon, fluorinated carbon resins; or a porous material into which filler or Fullerene is blended.

A first via hole 5 having a size of 100 nm to 500 nm for bonding the wiring to active areas of elements in the underlying layer or the lower layer wiring 2 is formed in the first interlayer insulating layer 3, and a second via hole 6 having a size 100 nm to 1000 nm in which a first wiring will be formed is formed in the second interlayer insulating film 4. In such a manner, a pattern having a dual damascene structure is formed (refer to FIG. 1(a)).

Forming of these via hole is performed using well known lithography or etching technology. An example has been described in which a second via hole 6 is formed after the first via hole 5 has been formed. Alternatively, the first via hole 5 may be formed after the second via hole 6 has been formed.

Subsequently, a metal oxide film 7a which contains one or more metals which become the barrier metal film is formed to provide a thickness of 5 to 100 nm along the bottom and side wall of the first and second via holes 5 and 6 in a conformal manner by a chemical vapor deposition (CVD) process and the like (refer to FIG. 1(b)).

Formation of the film of tantalum oxide is carried out while vaporized $Ta(OC_2H_5)_5$ and oxygen is introduced into a chamber at a flow rate of about 500 sccm. The film of tantalum oxide 7a having an electrical conductivity, which is not insulating can be formed by lowering the film forming temperature to not higher than 300° C. and decreasing the supply rate of oxygen 300 sccm or less.

Then, the substrate 1 having the metal oxide film 7(a), and preferably a tantalum oxide film, formed thereon is dipped in an aqueous solution 10 of hydrogen ions-containing ionic water, sulfuric acid or hydrochloric acid and a negative biasing voltage is applied to the metal oxide film 7(a), and preferably a tantalum oxide film. An electrode 18 which in this embodiment, is an anode, serving as a counter electrode is made of platinum and the like. The metal oxide film 7a (e.g., tantalum oxide film) is reduced to a metal film 7d (e.g., a metal film of tantalum) simultaneously with generation of water at a electrode 29 which in this instance is a cathode by conducting a current for about 1 minute to 10 hours at a temperature of the aqueous solution 10 from room temperature to 80° C. and a current density of 0.1 to 50 A/dm². Since the electrical conductivity of the metal oxide 7a (e.g., tantalum oxide) is enhanced as this electrochemical reaction advances, the current density may be changed in accordance with the advance in reaction. At initiation of the reaction, a current density of 50 A/dm² may be imposed to promote the reaction and thereafter a current density of about 5 A/dm² may be applied. This reaction causes the metal film 7d (e.g., of tantalum) having a very high purity to be formed along the underlying pattern (refer to FIG. 1(c)).

In the figures, electrodes (1) and (2) may serve as an anode and cathode respectively, but it is to be understood that their roles will reverse for reverse biasing.

Referring now to FIG. 2, the substrate 1 having the metal film 7d (e.g., of tantalum) thereon is dipped in a plating bath that contains a metal which becomes a main material of wiring, such as a plating bath 11 in which copper ions of copper sulfate are present. By applying a negative biasing voltage to the metal film 7d (e.g., of tantalum), the film 7d is caused to serve as anode 9, and ions of metal such as copper in the plating bath 11 are electrochemically reduced so that a layer of precipitated metal such as copper 13a is formed on the surface of the film of the metal 7d (FIG. 2(d), such as tantalum.

At this plating step, platinum or copper is used for the anode 8, the temperature of the plating bath 11 is preset to about 80° C. and the current density is preset to 0.1 A/dm² to 50 A/dm². A pulsated plating process may be conducted in which the current amplitude or the direction of bias current flow is changed or the current is turned on/off. This process causes a layer of precipitated metal such as copper 13a to be formed on the metal film 7d (e.g., of tantalum) (refer to FIG. 2(e)).

Subsequently, a metal wiring layer 13b of copper is completed by polishing this precipitated metal film of copper 13a by, for example, a chemical and mechanical polishing process (CMP process) (refer to FIG. 2(f)).

In order to form multiple layers, steps shown in FIGS. 1(a) to 1(c), and FIGS. 2(d) to 2(f) are sequentially repeated.

Although an example in which tantalum is used as a metal which will become the barrier metal has been described, similar effects are obtained even if titanium, titanium oxide and the like are used as the metal which becomes the barrier metal.

Although the example in which the metal which becomes a main material of the wiring layer is formed by the electrolytic plating process, the wiring layer may be formed by the sputtering or CVD process.

The electrochemical reaction which causes the reduction of the metal oxide film 7a, e.g., tantalum oxide, to the metal film 7d, e.g., tantalum film, in the first example is represented by a formula (1).

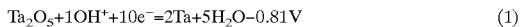

$$Ta_2O_5+10OH^++10e^-=2Ta+5H_2O-0.81V \qquad (1)$$

Since the film having an excellent coverage even for a pattern having a high aspect ratio and a complicated pattern can be obtained in accordance with the above-mentioned process, a film of tantalum, a barrier metal which is necessary to form copper wiring using a silicon oxide film as an insulating film can be formed to provide an excellent coverage.

Example 2

A second example 2 of a process for forming fine wiring in accordance with the present invention will be described.

Figure 3:
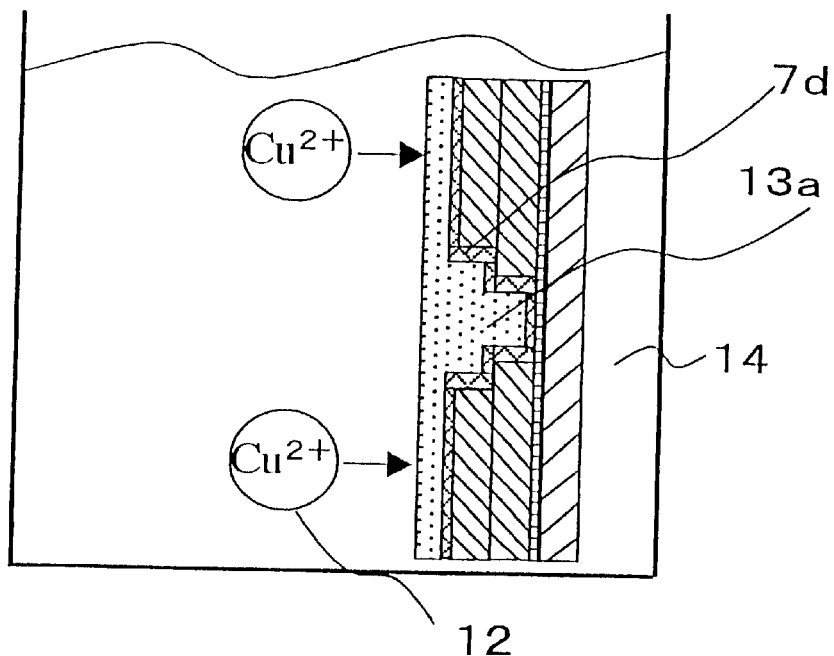
FIG. 3 is a schematic sectional view showing one step of a process for forming a fine wiring of the second example of the present invention.

FIG. 3 is a schematic sectional view explaining the second example of the present invention. The second example 2 is identical with the first example 1 except that the plating step as shown in FIG. 2(d) in the latter example is replaced by an electroless plating step shown in FIG. 3 in the former example 1. The second example of the present invention will be described with reference to FIGS. 1 through 3.

Referring now to FIG. 1, a pattern in which wiring material will be buried or embedded is formed as similarly to the first example. For example, a metal film 7a, e.g., tantalum oxide film is formed (FIG. 1(b)) and is then electrochemically reduced to a metal film e.g., tantalum 7d (FIG. 1(c)).

Referring now to FIG. 3, a substrate 1 having the metal film 7d, e.g., of tantalum film, thereon is dipped into an electroless plating bath 14 in which ions of copper such as copper sulfate and a reducing agent of formaldehyde and the like exists. This causes the electroless plating process to proceed. In this plating process, a copper layer 13a is precipitated on the tantalum film 7d by reducing copper ions 12 using a reducing agent.

Accordingly, no anode electrode is necessary unlike the electroplating process. Dipping of the substrate 1 into the electroless bath 14 after it has been dipped into a reducing solution as the preliminary treatment causes copper ions to be precipitated, resulting in that the layer of the precipitated copper is formed on the metal (e.g., tantalum film) film 7d, (FIG. 3). It is preferred to preset the temperature of the electroless plating bath 14 in a range between room temperature and about 80° C. and hydrogen ion concentration of the aqueous solution pH be set in a range between 7 and 12.

Referring now to FIG. 2 again, a copper wiring layer 13b is completed by polishing the layer of the precipitated copper 13a formed on the metal film 7d, (e.g., of tantalum film) by the chemical and mechanical polishing process as is similarly to the first example 1 (refer to FIGS. 2(e) and 2(f)).

A major difference between the first and second examples resides in that copper which will be a wiring material is formed by the electroless plating process after the film of a metal oxide which is excellent in coverage is reduced to the metal. An apparatus using the electroless plating process in the second example is lower in cost and enables more mass production in comparison with the first embodiment. A film having less pinholes can be formed over the entire of the substrate.

Figure 4:
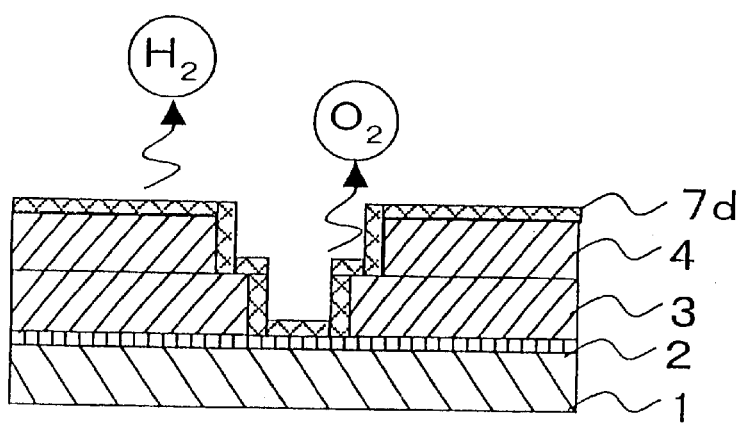
FIG. 4 is a schematic sectional view showing one step of a process for forming a fine wiring of the third example of the present invention.

A third example of the present invention will be described. FIG. 4 is a schematic sectional view explaining the third example of the present invention. FIG. 4 shows, a step in the third example which is added between the reducing step as shown in FIG. 1(c) explaining the first example and the plating step of FIG. 2(d). The third example of the present invention will be described with reference to FIGS. 1, 2 and 4.

Referring now to FIG. 1, in the third Example of the present invention a pattern in which the wiring material is embedded is formed. The metal film 7a (e.g., tantalum oxide film) is formed and is then electrochemically reduced to the metal film e.g., film of tantalum (FIGS. 1(a) to 1(c)).

Referring now to FIG. 4, the substrate is then heated for one minutes to 1 hour at a temperature of 150° C. to 400° C. under a reduced pressure not higher than 10 m Torr or in an atmosphere of nitrogen or inert gas, the oxygen concentration of which is not higher than 1% by volume. This heating treatment enables hydrogen or oxygen and the like which may be incorporated(contaminated) into the film on its reduction to be completely eliminated from the film, so that the electrical conductivity of the metal film 7d (e.g., of tantalum) can be more enhanced.

Subsequently, a layer of copper wiring 13b is formed (refer to FIGS. 2(e) and (f)) by forming a layer of precipitated copper 13a on the film 7d (e.g., of tantalum) by the electroplating process CVD or sputtering process (refer to FIG. 2(d)).

A major difference between the third and second examples resides in that heat treatment of the reduced metal oxide film is conducted at a reduced pressure or in the inert atmosphere. This heat treatment of the reduced metal film at an reduced pressure or in the inert atmosphere prevents the metal, e.g., tantalum from being oxidized and completely eliminates a small amount of hydrogen or oxygen, which may be contaminated in the metal, e.g., tantalum film, for preventing the metal, e.g., tantalum film from deteriorating. This degassing treatment provides an effect that unqualified film is not liable to occur when the CVD or sputtering process is conducted at the subsequent copper wiring layer forming step.

Example 4

Figure 5:
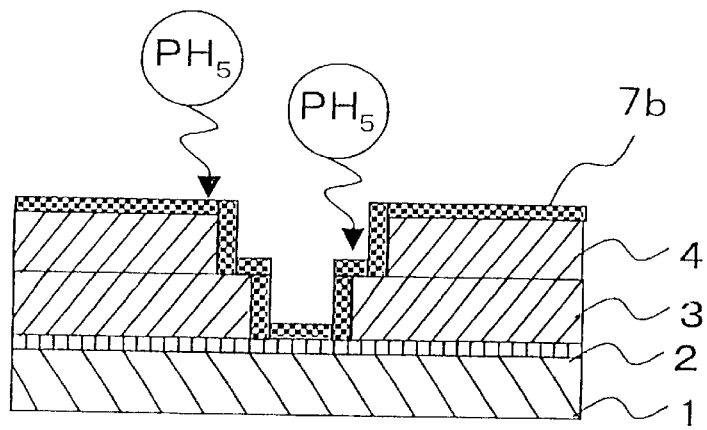
FIG. 5(a), FIG. 5(b) and FIG. 5(c) are schematic sectional views showing one step of a process for forming a fine wiring of the fourth example of the present invention.
Figure 5:
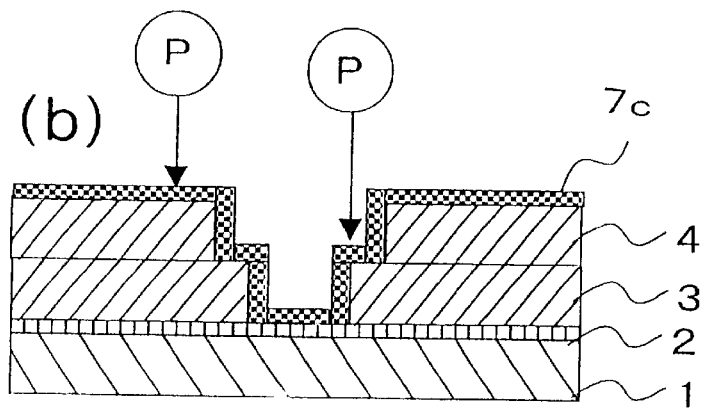
Figure 5:
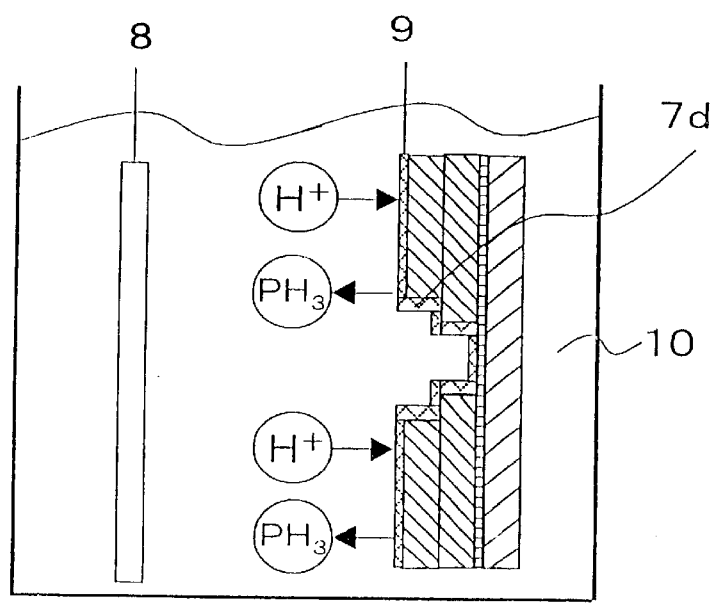

A fourth example of the present invention will be described. FIGS. 5(a), 5(b) and 5(c) are sectional views showing a step of FIG. 5(a) by which the oxide film forming step in FIG. 1(b) referred in the description of the first example is replaced; a step of FIG. 5(b) which is added between the oxide film forming step in FIG. 1(b) and the reducing step in FIG. 1(c), and a step of FIG. 5(c) by which the reducing step in FIG. 1(c) is replaced, respectively. Now, the fourth example of the present invention will be described with reference to FIGS. 1, 2 and 5.

Referring now to FIG. 1, in this fourth example, a pattern in which wiring material is to be embedded is formed and the film of tantalum oxide 7a is formed similarly to the first example. When the metal film 7a, e.g., tantalum oxide film is formed similarly to the first example. When the metal film 7a, e.g., tantalum oxide film is formed by the CVD process, $BH_3$ gas or $PH_5$ gas and the like is introduced at a rate 10 to 500 sccm. This causes the metal film 7a, e.g., tantalum oxide film to contain about 0.01% to several % of boron or phosphorous so that the metal oxide 7b, e.g., tantalum oxide film, containing same is formed (refer to FIG. 5(a)). The gas(ses) to be introduced may include a material which is capable of supplying electrically conductive carriers such as electrons or holes in the film 7b or a material itself having an electrical conductivity.

An ion implantation process may be used for introducing these elements into the metal film 7a, e.g., tantalum oxide film. In this case, after the metal oxide film 7a, e.g., tantalum oxide film, has been formed, it is transformed into the tantalum oxide film 7c having an enhanced electrical conductivity by implanting boron, phosphorous or metal atoms into the metal film 7a, e.g., tantalum oxide film by an ion implantation process so that the atoms in the film are 0.01% to several % (refer to FIG. 5(b)). This ion implantation process may be applied to the metal oxide film 7b, e.g., tantalum oxide film, to which boron or phosphorous has been preliminarily introduced.

These elements are principally intended to enhance the electrical conductivity of the metal oxide film, e.g., tantalum oxide film. Any elements other than the above-mentioned elements may be used if they provide this effect. However, if the film of metal, e.g., tantalum film having a high purity is to be manufactured, an element should be chosen which will be leached out into the aqueous solution 10 when the metal oxide, e.g., tantalum oxide, is reduced to metal, e.g., tantalum. In other words, only such an element should be chosen so that the standard electrode potential is higher than the potential of an electrode at which the metal oxide e.g., tantalum oxide is reduced to metal oxide e.g., tantalum oxide, when the metal oxide film, e.g., tantalum oxide film, 7b or 7c is reduced at next step. For example, phosphorous may be chosen (refer to FIG. 5(c)).

Then the substrate 1 having the metal oxide film, e.g., tantalum oxide film, 7b or 7c formed thereon is dipped in an aqueous solution 10 of hydrogen ions-containing ion water, sulfuric acid or hydrochloric acid and a negative biasing voltage is applied to the metal oxide film, e.g., tantalum oxide film, 7a. An anode electrode 8 serving as a counter electrode is made of platinum and the like. The temperature of the aqueous solution 10 is preset in a range from room temperature to 80° C. and the current density is preset in a range of 0.1 to 50 A/dm$^2$, under which conditions current is applied for one minutes to 10 hours, to generate water at the cathod 9 while simultaneously reducing the metal oxide film, e.g., tantalum oxide film, 7b or 7c into the tantalum metal film 7d.

Subsequently a metal wiring layer 13b of copper is formed through forming a precipitated metal film 13a of copper by the electroplating process similarly to the first example (refer to FIG. 2(d) to 2(f)). The metal wiring layer 13b may be formed by the sputtering or CVD process.

In the fourth example, a material which becomes an electrically conductive material such as metal and the like or an element which is capable of supplying carriers may be incorporated in the film by the ion implantation process when the metal oxide film, e.g., tantalum oxide film, is formed by the CVD process or after the metal oxide film, e.g., tantalum oxide film, has been formed. This enhances the electrical conductivity of the metal oxide film, e.g., tantalum oxide film, resulting in a smooth reduction process.

If an element which is more easily dissolved into the solution than tantalum oxide, for example, phosphorous exhibiting a high potential as the standard electrode potential as shown in the following reaction formula (2) is used, it is easy to eliminate the implanted element from the film in the course of reduction from metal oxide, e.g., tantalum oxide, to metal, e.g., tantalum.

$$P+3H^{+}+3e^{-}=PH_{3}-0.063V \quad (2)$$

Example 5

Figure 6:
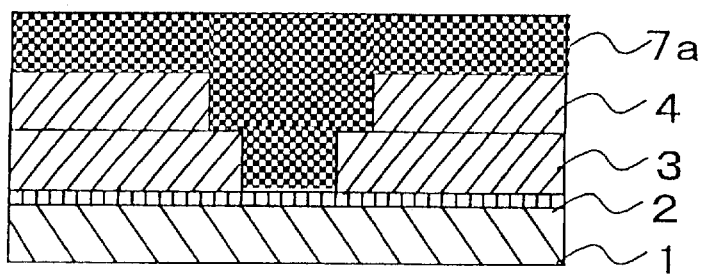
FIG. 6(a), FIG. 6(b) and FIG. 6(c) are schematic sectional views showing a sequence of steps of a process for forming a fine wiring of the fifth example of the present invention.
Figure 6:
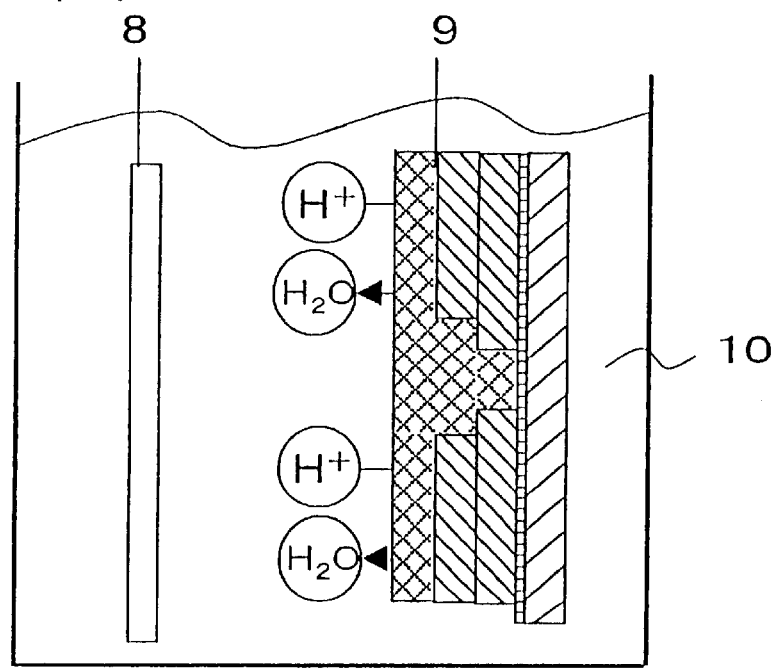
Figure 6:
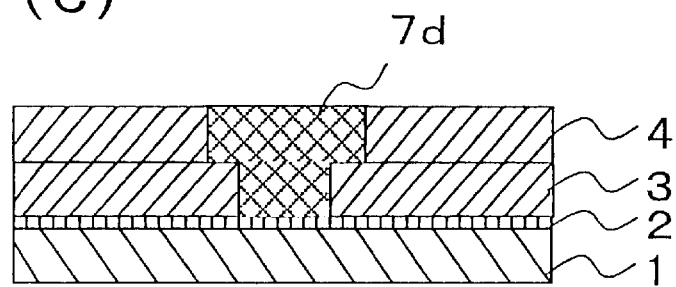

A fifth example of the present invention will now be described. FIGS. 6(a) to 6(c) are views explaining the sequential steps of the fifth example of process for forming a fine wiring in accordance with the present invention.

In the fifth example of the present invention, a pattern in which wiring material is embedded is formed similarly to the first example (refer to FIG. 1(a)).

Referring now to FIG. 6(a), a metal oxide film 7a, e.g., tantalum oxide film, having a thickness of 50 to 1000 nm is formed by the CVD process so that the via holes 5 and 6 are completely filled.

Formation of the film of metal oxide 7a, e.g., tantalum oxide, is carried out while vaporized Ta(OC$_2$H$_5$)$_5$ and oxygen are introduced at about 500 sccm into a CVD chamber.

The film of metal 7a, e.g., tantalum oxide, having an electrical conductivity can be formed by lowering the film forming temperature to not higher than 300° C. and decreasing the supply rate of oxygen 300 sccm or less to such an extent that the coverage is not influenced.

Then the substrate 1 having the metal oxide film 7a, e.g., tantalum oxide film, formed thereon is dipped in an aqueous solution 10 of hydrogen ions-containing ion water, sulfuric acid or hydrochloric acid and a negative biasing voltage is applied to the metal oxide film 7a, e.g., tantalum oxide film. An anode electrode 8 serving as an opposite electrode is made of platinum and the like. The metal oxide film 7a, e.g., tantalum oxide film, is reduced to the metal film e.g. of tantalum 7d simultaneously with generation of water at a cathode 9 by conducting a current for about 1 minute to 10 hours at the temperature of the aqueous solution 10 from room temperature to 8° C. and the current density of 0.1 to 50 A/dm$^2$. Since the electrical conductivity of the metal oxide film 7a, e.g., tantalum oxide, is enhanced as this electrochemical reaction advances, the current density may be changed in accordance with this advance. On initiation of the reaction, the current density of 50 A/dm$^2$ may be imposed to promote the reaction and thereafter the current density of about 5 A/dm$^2$ may be applied. This reaction causes the metal film 7d e.g., of tantalum, having a very high purity to be formed over the entire surface of a wafer (refer to FIG. 6(b)).

Subsequently, a metal wiring layer 7d e.g., of tantalum is completed by polishing this precipitated metal film 7d, e.g. of tantalum on the second interlayer insulating film 4 by, for example, a chemical and mechanical polishing process (refer to FIG. 6(c)).

In order to form multiple layers, steps shown in FIGS. 1(a) to 1(c), and FIGS. 6(d) to 6(c) are repeated.

In the fifth embodiment, a metal oxide film having an excellent embedding ability can be formed for a complicated pattern or that having a high aspect ratio. A metal film having an excellent embedding ability can be obtained by electrochemically reducing the resultant metal oxide film. Since tantalum is directly used as wiring metal in the present examples, necessity to form a layer of metal which will become a wiring material on the tantalum film by the electroplating, electroless plating sputtering or CVD process is eliminated, resulting in considerable reduction in the number of steps necessary for the fine wiring forming process.

The meritorious effect of the present invention are summarized as follows.

As mentioned above, the present invention provides the advantages which will be described.

A first advantage of the present invention resides in that a uniform and qualified barrier metal film can be formed on the side wall and bottom of a pattern in an excellent step coverage for the pattern having a high aspect ratio of the wiring height to the wiring width or the distance between wirings without exposing the underlying layer (material) of the pattern. This contributes to an enhancement of the reliability and yield of high integrated semiconductor devices.

A second advantage of the present invention resides in that a main wiring material is uniformly charged in the pattern on which the barrier metal film is formed so that a fine wiring having a low resistance can be formed.

The reasons why the above-mentioned advantages can be obtained will be described in comparison with the prior art.

Since a shadow area in which the barrier metal deposited on a projecting portion prevents particles from flight is generated in a prior art for forming a barrier metal in a hole by, for example, sputtering process, an area at which the underlying layer is exposed may occur in a recess. Since the barrier metal is selectively grown depending upon the material and crystal orientation of the underlying layer, when a metal which becomes the barrier metal is directly deposited by the CVD process, it is hard to uniformly form the barrier metal film on the side wall and bottom of the opening. Some metals per se are hard to precipitate.

In contrast to this, the selectivity of the growth of the barrier metal will not cause a problem since a film is formed in the via hole by using the barrier metal in the form of metal oxide or metal salt, but not metal in the present invention. If the CVD process is used, a film having a uniform thickness which is excellent in the step coverage can be formed. If the film of the metal oxide or metal salt is reduced in a solution containing hydrogen ions, the film can be transformed into a metal film. A high quality and uniform barrier metal film can be formed.

It is preferable for the metal oxide or metal salt to have a high electrical conductivity in order to quickly and positively form a high quality metal film by reducing the metal oxide or metal salt in a solution. The present invention may include a technique for adjusting the film forming conditions (temperature and flow rate of supplied oxygen), a technique for heating the formed film in an inert atmosphere, a technique for incorporating a gas containing an element having an electrical conductivity in the film after the film has been formed and a technique for directly implanting an element having an electrical conductivity into the film after the film has been formed. Use of these techniques enables a high quality ant uniform barrier metal film which is excellent in step coverage to be formed without exposing an underlying layer.

After the metal which becomes a main material of the wiring is precipitated on the thus formed barrier metal film by a process such as electrolytic plating or electroless plating, the wiring metal can be buried or embedded in the hole by removing the metal portion extending beyond the hole by a chemical and mechanical polishing process.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A process for forming a fine wiring comprising:

(a) depositing a barrier metal oxide film or barrier metal salt film, (b) reducing said barrier metal oxide film or barrier metal salt film to form a barrier metal film over which a wiring layer is to be formed, and (c) applying a wiring film on said barrier metal film wherein the barrier metal film is to prevent migration.

2. A process for forming a fine wiring comprising:

(a) depositing a barrier metal oxide film or barrier metal salt film, (b) reducing said barrier metal oxide film or barrier metal salt film to form a barrier metal film in a pattern formed on an interlayer insulating layer disposed on a substrate; wherein the barrier metal filmis to prevent ion migration and (c) applying a wiring layer to said pattern by an electrolytic plating method or electroless plating method.

3. A process for manufacturing a semiconductor device including a step for forming a fine wiring, wherein said process comprises the steps of:

(a) forming a film of a metal oxide or metal salt, containing a first metal element; or containing a first metal element and one or more elements which are different from the first metal element, which becomes a barrier metal film or wiring layer as any one of layers which are provided on a substrate; and (b) converting said metal oxide film or metal salt film into a metal film by reducing it in a solution which contains hydrogen ions.

4. A process for manufacturing a semiconductor device including a step for forming a fine wiring, wherein said process comprises the steps of:

(a) forming a film of a metal oxide or metal salt, containing a first metal element; or containing a first metal element and one or more elements which are different from the first metal element, which becomes a barrier metal film as any one of layers which are provided on the substrate;

(b) converting said metal oxide film or metal salt film into a metal film by reducing it in a solution which contains hydrogen ions; and (c) heat treating said metal film under a reduced pressure or in inert atmosphere.

5. A process for manufacturing a semiconductor device including a step for forming a fine wiring, wherein said process comprises the steps of:

(a) forming a film of a metal oxide or metal salt, containing a first metal element; or containing a first metal element and one or more elements which are different from the first metal element, which becomes a barrier metal film as any one of layers which are provided on a substrate;

(b) converting said metal oxide film or metal salt film into a metal film by reducing it in a solution which contains hydrogen ions; and (c) forming a wiring layer on said metal film which becomes the barrier metal film by electrochemically precipitating ions of said metal in an electrolytic solution which contains ions of said metal which becomes a main material of the wiring layer.

6. A process for manufacturing a semiconductor device including a step for forming a fine wiring, wherein said process comprises the steps of:

(a) forming a film of a metal oxide or metal salt, containing a first metal element; or containing a first metal element and one or more elements which are different from the main metal element, which becomes a barrier metal film as any one of layers which are provided on a substrate;

(b) converting said metal oxide film or metal salt film into a barrier metal film by reducing it in a solution containing hydrogen ions; and (c) forming a wiring layer on said barrier metal film by electrochemically precipitating ions of a metal by an electroless process in a electrolytic solution which contains ions of this metal which becomes a main material of the wiring layer.

7. A process as defined in claim 3, wherein a plurality of metals which will form a barrier metal film or a wiring layer comprise a first metal and a metal to be added to the first metal, in that said metal to be added is selected from such a combination of metals that the electrode potential required for reducing the metal to be added to ions is higher than a standard electrode potential required for reducing the film of the oxide or salt of said first metal to be reduced to said metal at the reducing step (b), wherein said metal to be added is removed as ions in said solution at said step (b) to reduce the plurality of which form the metal oxide or metal salt film which becomes said barrier metal film or said wiring layer.

8. A process as defined in claim 3 wherein the metal oxide or metal salt film containing a first metal element or containing a first metal element and one or more elements which are different from the first metal element which will form the barrier metal film or wiring layer is formed by a chemical vapor deposition process at the step (a).

9. A process as defined in claim 3 wherein when the metal oxide or metal salt film containing a first metal element or containing a first metal element and one or more elements which are different from the first metal element which will form the barrier metal film or wiring layer is formed by a chemical vapor deposition process at the step (a), a compound gas which contains an element having an electrical conductivity is incorporated into said metal oxide or metal salt film.

10. A process as defined in claim 3 wherein after the metal oxide or metal salt film containing a first metal element or containing a first metal element and one or more elements which are different from the first metal element which will form the barrier metal film or wiring layer has been formed by a chemical vapor deposition process at the step (a), an element having an electrical conductivity is incorporated into said metal oxide film or metal salt film prior to the reducing step (b).

11. A process as defined in claim 9 wherein said compound gas to be incorporated is a gas of a boron or phosphorous compound.

12. A process as defined in claim 10 wherein said compound gas to be incorporated is a gas of a boron or phosphorous compound.

13. A process for forming a fine wiring comprising:

(a) depositing a metal oxide film or metal salt film;

(b) reducing said metal oxide film or metal salt film to form a metal film which becomes a barrier metal film over which a wiring layer is to be formed, wherein said metal film which will form the barrier metal film comprises tantalum.

14. A process as defined in claim 3 wherein said metal which will form the barrier metal film is tantalum and in that said main material of the wiring layer is copper.

15. A process for forming a fine wiring comprising:

(a) depositing a barrier metal oxide film or barrier metal salt film; and (b) reducing said barrier metal oxide film or barrier metal salt film to form a barrier metal film over which a wiring layer is to be formed wherein said barrier metal oxide film or barrier metal salt film is deposited within a recess, groove or via hole wherein the barrier metal film is to prevent ion migration.

16. The process as defined in claim 3, wherein said metal oxide film or metal salt film is deposited on any of layers disposed on the substrate including inner wall of a via hole disposed on said any of layers.

17. A process for forming a fine wiring comprising (a) depositing a metal salt film; and (b) reducing said metal salt film to form a metal film which becomes a wiring layer.

* * * * *

UNITED STATES PATENT AND TRADEMARK OFFICE
CERTIFICATE OF CORRECTION

PATENT NO. : 6,294,467 B1
DATED : September 25, 2001
INVENTOR(S) : Takeshi Yokoyama et al.

It is certified that error appears in the above-identified patent and that said Letters Patent is hereby corrected as shown below:

Column 1,
Line 18, "Accordingly, ..." should not begin a new paragraph.

Column 4,
Line 50, "1(c)" should read -- 1(c)) --

Column 6,
Line 61, "Fig. 3..." should not begin a new paragraph.

Column 7,
Line 21, "metal (e.g., tantalum film) film 7d," should read -- metal film 7d, (e.g., tantalum film --

Column 8,
Line 3, "the film 7d (e.g. of tantalum)" should read -- the film (e.g. -- of tantalum film" --
Lines 45-46, "7b, e.g., tantalum oxide film" should read -- oxide film 7b, e.g., tantalum oxide film --
Lines 54-55, "the metal oxide film 7a, e.g., Tantalum oxide film" should read -- the metal oxide film 7c, such as tantalum oxide, has been formed --

Column 9,
Line 11, "reduced to metal oxide, e.g., tantalum oxide," should read -- reduced to metal, e.g., tantalum --

UNITED STATES PATENT AND TRADEMARK OFFICE
CERTIFICATE OF CORRECTION

PATENT NO.    : 6,294,467 B1
DATED         : September 25, 2001
INVENTOR(S)   : Takeshi Yokoyama et al.

It is certified that error appears in the above-identified patent and that said Letters Patent is hereby corrected as shown below:

Column 10,
Lines 34-35, "film 7d, e.g. of tantalum" should read -- film e.g. of tantalum 7d --

Column 12,
Line 5, after "prevent" insert -- ion --
Line 13, "filmis" should read -- film is --

Signed and Sealed this

Fifteenth Day of April, 2003

JAMES E. ROGAN
*Director of the United States Patent and Trademark Office*